United States Patent
Yamasaki

Patent Number: 5,162,678
Date of Patent: Nov. 10, 1992

[54] TEMPERATURE COMPENSATION CONTROL CIRCUIT FOR EXPONENTIAL GAIN FUNCTION OF AN AGC AMPLIFIER

[75] Inventor: Richard G. Yamasaki, Torrance, Calif.

[73] Assignee: Silicon Systems, Inc., Tustin, Calif.

[21] Appl. No.: 584,201

[22] Filed: Sep. 18, 1990

[51] Int. Cl.$^5$ .................. G06G 7/12; H03F 1/30
[52] U.S. Cl. ................... 307/491; 307/493; 307/492; 307/145; 330/254; 330/256
[58] Field of Search ............. 330/254, 256, 149, 279; 307/491, 493, 492, 494; 323/312; 328/145

[56] References Cited

U.S. PATENT DOCUMENTS

| | | | |
|---|---|---|---|
| 3,940,708 | 2/1976 | Sumi et al. | 330/254 |
| 4,327,333 | 4/1982 | Wilcox | 330/254 |
| 4,528,516 | 7/1985 | Hill, III | 330/254 |
| 4,605,906 | 8/1986 | Miller | 330/256 |
| 5,030,924 | 7/1991 | Fritz | 330/256 |

*Primary Examiner*—Stanley D. Miller
*Assistant Examiner*—Toan Tran
*Attorney, Agent, or Firm*—Hecker & Harriman

[57] ABSTRACT

A temperature compensation control circuit to maintain a constant control gain in an AGC (automatic gain control) amplifier. The present invention compensates for the inherent temperature dependence without using any special processing or non-standard device structures. The present invention utilizes the voltage drop across n diodes in series to produce the control voltage difference ($V_C - V_C^*$). These n series diodes are coupled to the collectors of a PNP emitter coupled pair with emitter resistance. This causes the control voltage difference to be dependent on temperature (nkT/q), but this dependency cancels out with the other inherent temperature dependency in the exponential function of the AGC amplifier which is also produced by a diode form. Thus, the present invention provides temperature compensation with minimum component matching problems and without the need for a PTAT (proportional to absolute temperature) current source.

17 Claims, 3 Drawing Sheets

TEMPERATURE COMPENSATION CONTROL CIRCUIT FOR EXPONENTIAL GAIN FUNCTION OF AN AGC AMPLIFIER

BACKGROUND OF THE INVENTION

1. Field of the Invention

This invention relates to the field of compensation for the inherent temperature dependence in automatic gain control amplifiers while retaining the exponential gain characteristic.

2. Background Art

The gain versus input control voltage for a typical automatic gain control (AGC) amplifier is usually an exponential function which results in constant control gain that is independent of the input signal amplitude. The constant gain characteristic allows the AGC feedback loop frequency compensation to be optimized for minimum transient settling time.

Previous technology for AGC amplifiers usually employ an emitter-coupled pair with diodes in a configuration such as a Gilbert Multiplier. However, the performance of these circuits suffer, since the exponential function is temperature dependent. The basic equation for the prior art AGC amplifier with an exponential gain control voltage is as follows:

$$V_O - V_O^* = (V_I - V_I^*)(R_L/R_E)\exp[(q/kT)(V_C^* - V_C)]$$

$(V_O - V_O^*)$ = differential output voltage $(V_I - V_I^*)$ = differential input voltage $(V_C - V_C^*)$ = differential control voltage $R_L$ = load resistance $R_E$ = emitter resistance k = Boltzman's Constant T = abolute temperature (degrees Kelvin)

q = electron charge

In this equation, the inherent dependency (q/kT) of the gain on temperature can be seen. When the gain $(V_O - V_O^*)$ versus $(V_C - V_C^*)$ of 25 dB range AGC is plotted, the gain range changes due to temperature variation by 8.4 dB over a 0° C. to 127° C. change.

To nullify this variation of gain, temperature compensated log-antilog exponential function amplifiers have been built using thermistor networks. The thermistor is a temperature-sensitive resistor that must be selected or trimmed for appropriate temperature compensation and be external to an integrated circuit.

Another prior art means of temperature compensation is accomplished by making the differential control voltage $(V_C - V_C^*)$ proportional to kT/q. In practice, however, this circuit is sensitive to the offset voltages in bipolar junction transistors. The circuit is also sensitive to the matching of the load resistors $R_L$ since their voltage drop distance appears as a control voltage difference. Furthermore, the circuit also has the disadvantage that a PTAT (proportional to absolute temperature) current source is required.

Therefore, it is an object of the present invention to compensate for the temperature dependency in the exponential gain control for an AGC amplifier.

It is another object of the present invention to compensate for the temperature dependence without using external devices.

It is another object of the present invention to suppress the temperature dependency without the disadvantage of requiring a PTAT device.

SUMMARY OF THE PRESENT INVENTION

The present invention implements a temperature compensation control circuit to maintain a constant control gain in an AGC (automatic gain control) amplifier. The present invention compensates for the inherent temperature dependence without using any special processing or nonstandard device structures. The present invention utilizes the voltage drop across n diodes in series to produce the control voltage difference $(V_C - V_C^*)$. These n series diodes are coupled to the collectors of a PNP emitter coupled pair with emitter resistance. This causes the control voltage difference to be dependent on temperature (nkT/q), but this dependency cancels out with the other inherent temperature dependency in the exponential function of the AGC amplifier which is also produced by a diode form. Thus, the present invention provides temperature compensation with minimum component matching problems and without the need for a PTAT (proportional to absolute temperature) current source.

DETAILED DESCRIPTION OF THE PRESENT INVENTION

An AGC amplifier using a temperature compensation control circuit is described. In the following description, numerous specific details, such as voltage, conductivity type, etc., are set forth in order to provide a more thorough understanding of the present invention. It will be apparent, however, to one skilled in the art, that the present invention may be practiced without these specific details. In other instances, well known features have not been described in detail in order to not obscure the present invention.

The gain of a prior art AGC amplifier is given by an exponential function in which the exponent consists of a ratio value. The exponential function is provided by using emitter coupled pair transistors, such as a Gilbert Multiplier. The denominator of the ratio is temperature dependent, resulting in the gain being temperature dependent. The present invention provides voltage control circuitry which results in the numerator of the exponential ratio being temperature dependent as well. As a result, voltage variations due to temperature changes are cancelled out and the gain becomes temperature independent.

Figure 1:
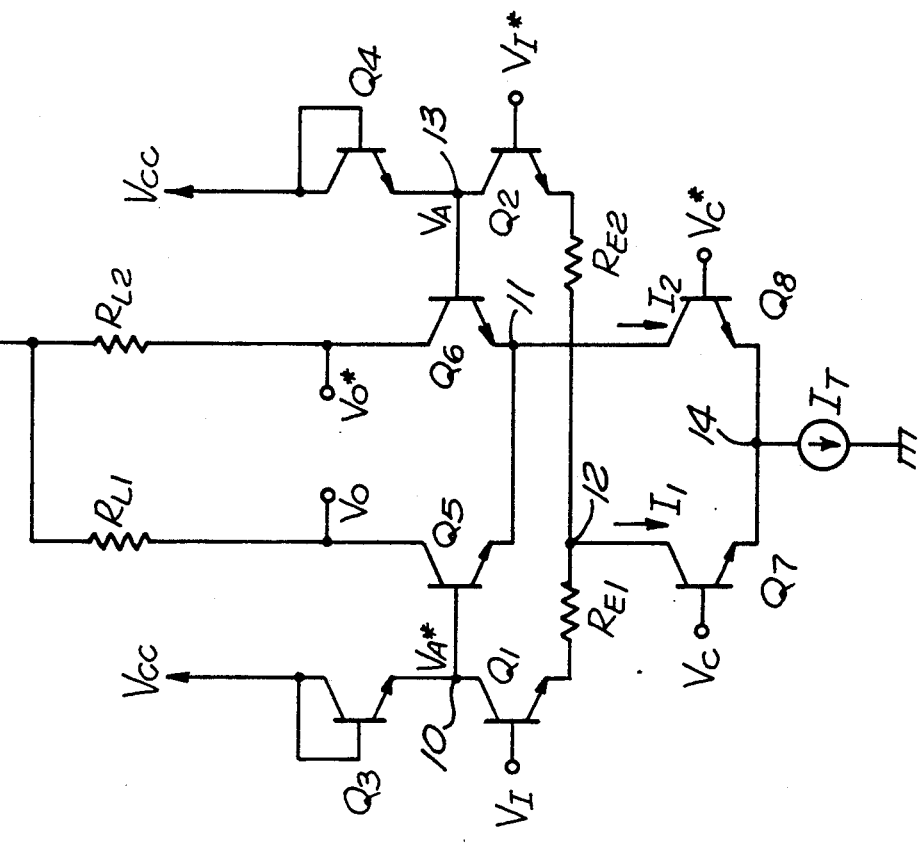
FIG. 1 is a circuit diagram of an AGC amplifier using a Gilbert Multiplier but having no temperature compensation.

An example of a prior art AGC amplifier using a Gilbert Multiplier is illustrated in FIG. 1. The prior art AGC circuit utilizes first and second gain stages consisting of first and second pairs of emitter coupled transistors. As shown in FIG. 1, emitter coupled transistor pairs Q1 and Q2 comprise one gain stage, and emitter coupled transistors Q5 and Q6 comprise a second gain stage. The differential output voltage is taken from the collectors of transistors Q5 and Q6. Supply voltage $V_{cc}$ is coupled through load resistance $R_{L1}$ to the collector of transistor Q5. $V_{cc}$ is also coupled through another load resistance $R_{L2}$ to the collector of transistor Q6.

The base of transistor Q5 is coupled to the collector of transistor Q1 and the emitter of diode-connected transistor Q3 at node 10. The base of transistor Q3 is coupled to the collector of transistor Q3. The base of transistor Q1 is coupled to input voltage $V_I$. The emitter of transistor Q1 is coupled to the collector of transistor Q7 through emitter resistance $R_{E1}$ at node 12. The emitter of transistor Q2 is also coupled to the collector of transistor Q7 through another emitter resistance $R_{E2}$ at node 12. The base of transistor Q7 is coupled to input voltage $V_C$ (control voltage). The emitters of transistors Q7 and Q8 are coupled to the current source $I_T$ at node 14. The current source is coupled to ground.

The base of transistor Q8 is coupled to control voltage $V_C^*$. The collector of transistor Q8 is coupled to the emitters of transistor Q5 and transistor Q6 at node 11. The base to transistor Q6 is coupled to the collector of transistor Q2 and coupled to the emitter of diode-connected transistor Q4 at node 13. Output voltage $V_o^*$ is taken from the collector of transistor Q6. The base of transistor Q4 is coupled to the collector of transistor Q4. The base of transistor Q2 is coupled to the input voltage $V_I^*$.

The voltage gain for the emitter-coupled pairs, Q1 and Q2, and Q5 and Q6, is equal to the ratio of the total resistance in the collector circuit to the total resistance in the emitter circuit. Thus, the differential gain at the collectors of $Q_1$ and $Q_2$ is approximately:

$$V_A - V_A^* = \frac{(KT/q)(V_I - V_I^*)}{(R_E)(I_1)} \quad \text{(Equation 1)}$$

$(kT/q)I_1$ = collector resistance $R_E$ = emitter resistance $I_1$ is the total current running through the emitter coupled pair and also runs through transistor Q7.

Similarly, the differential gain at the collectors of Q5 and Q6 is:

$$V_o - V_o^* = (R_L)(V_A V_A^*)(I_2)/(kT/q) \quad \text{(Equation 2)}$$

$R_L$ = collector resistance
$(kT/q)/I_2$ = emitter resistance $I_2$ is the total current running from transistor Q5 and Q6. Substituting equation 1 into equation 2:

$$V_O - V_O^* = \frac{R_L(V_I - V_I^*)(I_2/I_1)}{(R_E)}$$

Concerning the Gilbert Multiplier in the circuit, the equation for the differential control voltage at the bases of the emitter-coupled pair of transistors Q7 and Q8 is:

$$V_C^* - V_C = (kT/q)\ln(I_2/I_1) \quad \text{(Equation 4)}$$

which can also be expressed as:

$$I_2/I_1 = \exp[(q/kT)(V_C^* - V_C)] \quad \text{(Equation 5)}$$

Substituting equation 5 into equation 3:
$$V_0 - V_0^* = (V_I - V_I^*)(R_L/R_E)\exp[(q/kT)(V_C^* - V_C)] \quad \text{(Equation 6)}$$

Figure 2:
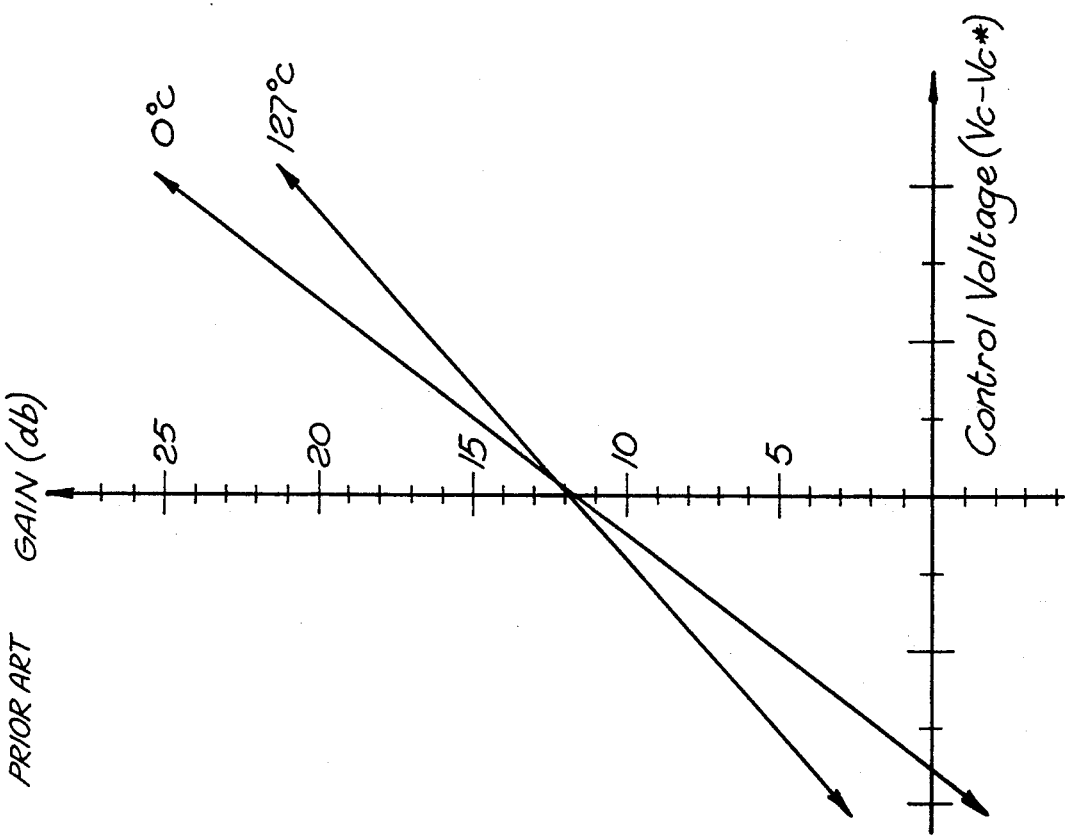
FIG. 2 is a plot of uncompensated temperature variation of gain versus control voltage.

This is the basic equation of an AGC amplifier with an exponential gain control. Problems arise due to the temperature dependence factor (q/KT) in the exponential term. An example of the temperature variation of the gain versus the differential control voltage $V_C - V_C^*$ of a 25 dB range AGC is plotted in FIG. 2. The gain range changes by 8.4 dB over a 0° C. to 127° C. change.

Figure 3:
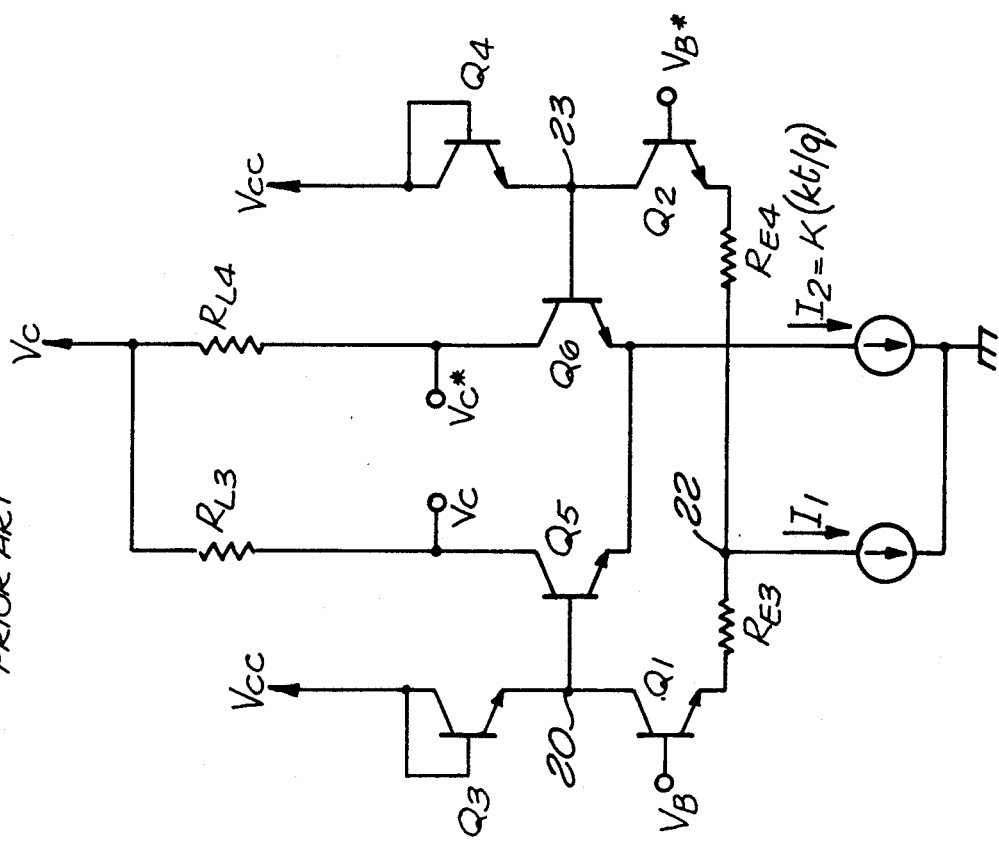
FIG. 3 is a circuit diagram of a prior art temperature compensation control circuit.

An example of a prior art temperature compensation scheme is illustrated in FIG. 3. In operation, the circuit in FIG. 3 is added on to the circuit of FIG. 1 to provide the proper differential control voltage for temperature compensation. The compensation circuit is made up of two emitter-coupled pairs and a PTAT current source to provide the required control voltage output. Control voltage $V_C$ is taken from the collector of transistor Q5 and $V_C^*$ is taken from the collector of transistor Q6. The collector of transistor Q5 is coupled to voltage supply $V_{cc}$ through resistor $R_{L3}$. The collector of Q6 is also coupled to $V_{cc}$ through another load resistor $R_{L4}$. The base of transistor Q5 is coupled to the collector of transistor Q1 and coupled to the emitter of transistor Q3 at node 20. The base of transistor Q3 is coupled to the collector of transistor Q3. The base of transistor Q1 is coupled to the input voltage $V_B$. The collector of transistor Q1 is coupled to current source $I_1$ through emitter resistance $R_{E3}$ at node 22. The emitter of transistor Q2 is also coupled to current source $I_1$ at node 22 through another emitter resistance $R_{E4}$. The base of transistor Q2 is coupled to the input voltage $V_B^*$. The collector of transistor Q2 is coupled to the base of Q6 and coupled to the emitter of transistor Q4 at node 23. The base of transistor Q4 is coupled to the collector of transistor Q4.

The role of this prior art circuit is to make the differential control voltage $V_C - V_C^*$ temperature dependent and therefore cancel out the other temperature factor in the differential output voltage equation. Since the circuit in FIG. 3 is similar to the circuit in FIG. 1, similar circuit analysis can be employed. It can be seen that the differential control voltage is:

$$V_C - V_C^* = \frac{R_L(V_B - V_B^*)(I_2/I_1)}{(R_E)}$$

A necessary element of this scheme is to make $I_2$ be a PTAT current source so that $I_2 = K (kT/q)$. Therefore:

$$V_C - V_C^* = \frac{R_L(V_B - V_B^*)K(kT/q)}{R_E(I_1)}$$

In this circuit, the (kT/q) terms cancel out, resulting in a temperature independent exponential function in the differential output voltage equation. However, drawbacks to using this method of temperature compensation include the sensitivity of the circuit toward the offset voltages of transistor pairs Q3–Q4, and Q5–Q6, since these offset voltages are amplified by the gain of transistors Q5 and Q6. Furthermore, the circuit is very sensitive to the matching of the two load resistors $R_{L3}$ and $R_{L4}$, since the voltage drop between the two makes up the differential control voltage. Thus, high precision resistors must be used. Another disadvantage to this prior art method is that a PTAT current source is required. Thus, the present invention generates a voltage control difference that has a temperature compensation term in its numeral, but is executed without undesirable post-processing or any PTAT devices.

Figure 4:
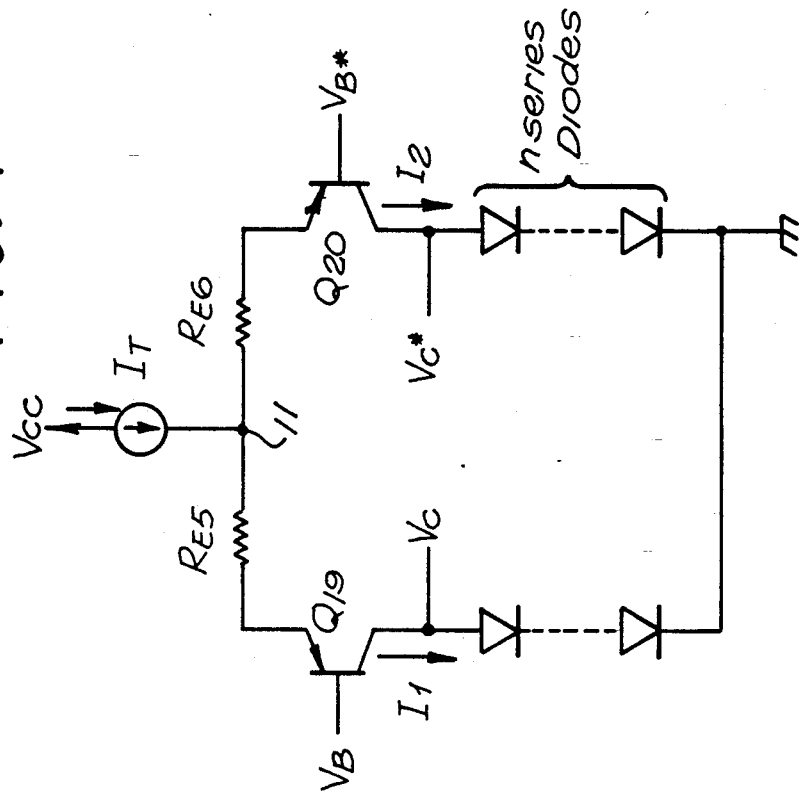
FIG. 4 is a circuit diagram of the temperature compensation control circuit of the preferred embodiment of the present invention.

An example of the preferred embodiment of the present invention is illustrated in FIG. 4. The control voltage difference is determined by the voltage drop across n diodes in series coupled to the collectors of an emitter coupled pair of PNP transistors.

The voltage supply $V_{cc}$ is coupled to node 11 through the current source $I_T$. The emitter of transistor Q19 is coupled to node 11 through resistor $R_{E5}$. The emitter of transistor Q20 is also coupled to node 11 through another resistor $R_{E6}$. The base of transistor Q19 is coupled to input voltage $V_B$. The control voltage $V_C$ is taken from the collector of transistor Q19. A number of n diodes in series are coupled to the collector of transistor Q19 with the positive terminal of the first diode coupled to the collector of transistor Q19 and the negative terminal of the last diode coupled to ground.

The base of transistor Q20 is coupled to input voltage $V_B^*$. The control voltage $V_C^*$ is taken from the collector of transistor Q20. A number of n diodes is coupled to the collector of transistor Q20 with the positive terminal of the first diode coupled to the collector of transistor Q20 and the negative terminal of the last diode coupled to ground.

Using similar analysis as that used for the Gilbert Multiplier in FIG. 1, the differential control voltage is equal to:

$$V_C - V_C^* = (nkT/q)\ln(I_1/I_2)$$

n = number of diodes in series.
$I_1$ = current running through transistor Q19.
$I_2$ = current running through transistor Q20.
This equation can also be represented as:

$$V_C - V_C^* = (nkT/q)\ln\frac{(I_T/2 + \Delta I/2)}{(I_T/2 - \Delta I/2)}$$

$$I_T = I_1 + I_2$$

$$\Delta I = |I_1 - I_2| = \frac{(V_B - V_B^*)}{R_E}$$

Ideally, $\Delta I/I_T$ should be much smaller than one. When this is true, then:

$$\ln\frac{(1 + \Delta I/I_T)}{(1 - \Delta I/I_T)} \approx \ln[(1 + 2(\Delta I/I_T)] \approx 2\Delta I/I_T$$

This is equal to $2(V_B - V_B^*)/R_E I_T$. Thus, the differential control voltage of the present invention is:

$$V_C - V_C^* = 2\frac{(nkT/q)(V_B - V_B^*)}{(R_E)(I_T)}$$

The accuracy of this approximation improves as n increases since $\Delta I/I_T$ can be made smaller. The series diode offset voltage sum also increases linearly with n.

Figure 5:
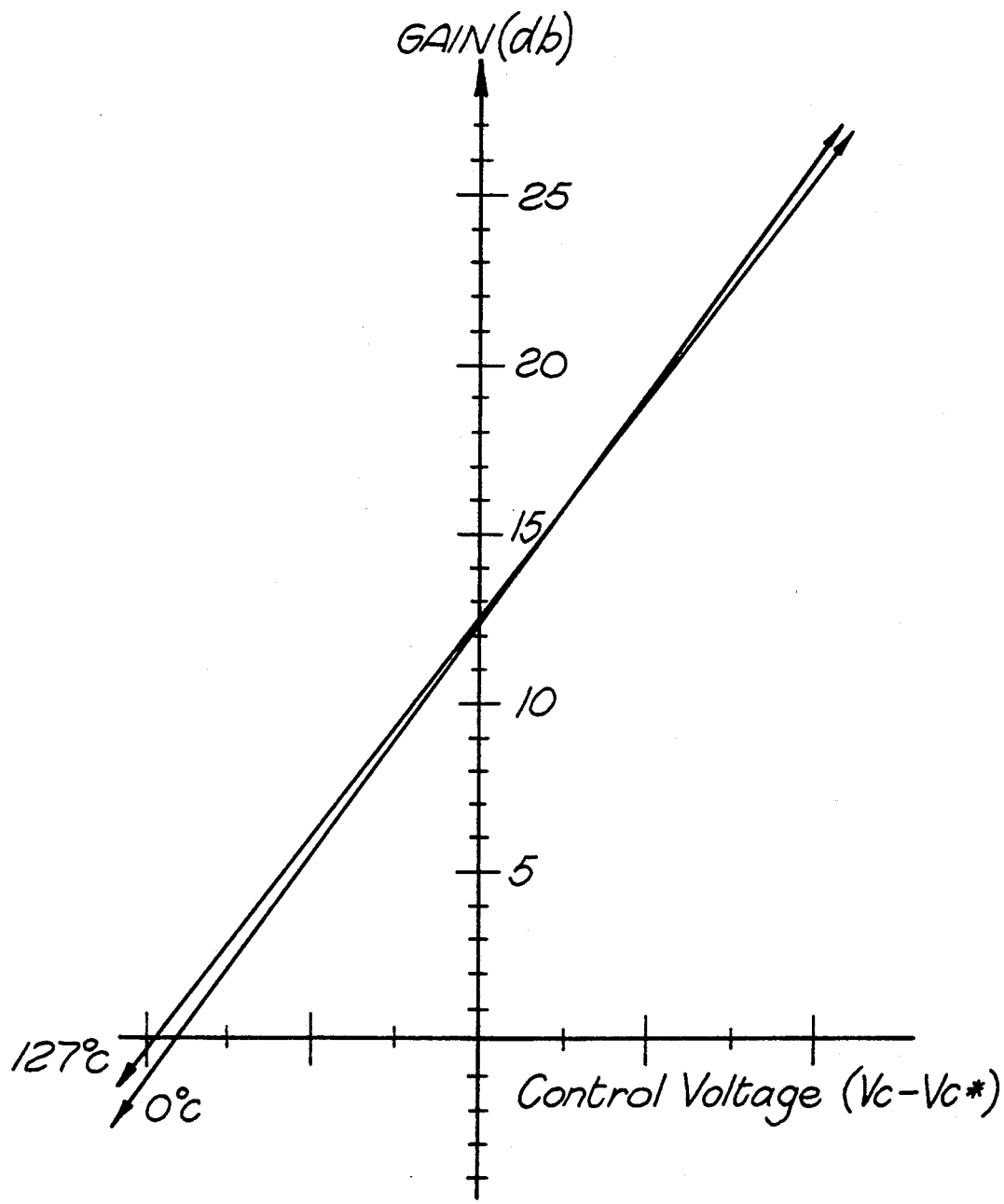
FIG. 5 is a plot of temperature compensated variation of gain versus control voltage.

An example of the temperature compensated variation of gain versus the differential control voltage is plotted in FIG. 5. The plot shown is for a 25 dB range AGC and an n=2. Although n is only equal to 2, from the plot it is evident that the gain change from 0° C. to 127° C. is small ($\approx 0.86$ db) when compared to the uncompensated gain change ($\approx 8.4$ db) shown in FIG. 2. Thus, when employing the circuit of the present invention, an approximate 263% gain change with temperature is reduced to about a 10.4% gain change.

Thus, a less complicated temperature compensation control circuit for an AGC with exponential gain has been described.

I claim:

1. A circuit comprising:
   a first gain stage coupled to a second gain stage wherein said first and second gain stage is an AGC amplifier;
   a third gain stage coupled to said first and second stage wherein said third stage is an exponential function stage;
   a fourth gain stage providing a control voltage difference that is proportional to temperature, output of said fourth gain stage coupled to input of said third gain stage, output of said first gain stage coupled to input of said second gain stage and said third gain stage coupled to said first and said second gain stage, said fourth gain stage comprising an emitter coupled pair of transistors with first and second sets of n diodes in series, n being an integer greater than zero, said first and second sets of diodes coupled to first and second outputs of said emitter coupled pair of transistors, respectively.

2. The circuit of claim 1 wherein said first gain stage comprises first and second emitter coupled transistors each with emitter resistance.

3. The circuit of claim 2 wherein said second gain stage comprises third and fourth emitter coupled transistors.

4. The circuit of claim 3 wherein said third gain stage comprises fifth and sixth emitter coupled transistors, and wherein a combination of said first, second and third gain stages is a Gilbert Multiplier.

5. The circuit of claim 4 wherein the collector of said fifth transistor is coupled to the emitters of said emitter coupled first and second transistors.

6. The circuit of claim 5 wherein the collector of said sixth transistor is coupled to the emitters of said emitter coupled third and fourth transistors.

7. The circuit of claim 4 wherein the bases of said fifth and sixth transistors are driven by said fourth gain stage.

8. An automatic gain control (AGC) amplifier, said amplifier comprising:
   an automatic gain control (AGC) means;
   an exponential function means coupled to said AGC means;
   a temperature compensation means comprising an emitter coupled pair of transistors with first and second sets of n diodes in series, n being an integer greater than zero, said first and second sets of diodes coupled to first and second outputs of said emitter coupled pair of transistors, respectively, said temperature compensation means coupled to input of said exponential function means.

9. The circuit of claim 8 wherein said automatic gain control means comprises a first gain stage which is comprised of first and second emitter coupled transistors, each with emitter resistance and a second gain stage which is comprised of third and fourth emitter coupled transistors.

10. The circuit of claim 9 wherein said exponential function means comprises fifth and sixth emitter coupled transistors, and wherein a combination of said automatic gain control means and said exponential function means is a Gilbert Multiplier.

11. The circuit of claim 10 wherein the collector of said fifth transistors coupled to the emitters of said emitter coupled first and second transistors.

12. The circuit of claim 11 wherein the collector of said sixth transistors is coupled to the emitters of said emitter coupled third and fourth transistors.

13. The circuit of claim 10 wherein the bases of said fifth and sixth transistors are driven by said temperature compensation means.

14. A temperature compensation circuit for compensating a temperature dependence in an exponential gain function stage of an AGC amplifier, said temperature compensation circuit comprising:

first and second emitter coupled transistors of a first conductivity type;

first and second sets of N diodes in series coupled to said first and second emitter coupled transistors, respectively, N being an integer greater than one;

differential control voltage applied to the bases of said first and second emitter coupled transistors;

collectors of said first and second emitter coupled transistors providing a differential voltage output;

said differential voltage output coupled to an input of said exponential gain function stage of said AGC amplifier, said exponential gain function stage coupled to an AGC stage of said AGC amplifier.

15. The circuit of claim 14 wherein said first conductivity type is P type (PNP).

16. The circuit of claim 14 wherein said temperature compensation circuit does not include a PTAT current source, and provides a gain control voltage to said AGC amplifier having an exponential gain function wherein an exponent is inversely proportional to temperature and proportional to said gain control voltage.

17. The circuit of claim 16 wherein said temperature compensation circuit drives the bases of third and fourth emitter coupled transistors of said exponential function stage of said AGC amplifier.

* * * * *